(12) United States Patent
Wong-Lam et al.

(10) Patent No.: US 6,629,310 B1
(45) Date of Patent: Sep. 30, 2003

(54) SYSTEM AND METHOD FOR ACCESSING INTERNAL REGISTERS IN INTEGRATED CIRCUITS

(75) Inventors: Ho Wai Wong-Lam, Los Altos, CA (US); Mark Douglas Naley, Santa Clara, CA (US); Albertus Franciscus Maria Geven, Eindhoven (NL); Henk Albert Hessel, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/469,885

(22) Filed: Dec. 22, 1999

(51) Int. Cl.$^7$ ................................................ G06F 17/50
(52) U.S. Cl. ............................ 716/17; 716/1; 395/829
(58) Field of Search ......................... 716/1–18; 395/829

(56) References Cited

U.S. PATENT DOCUMENTS

| | | | |
|---|---|---|---|
| 5,428,748 A | * 6/1995 | Davidson et al. | 710/9 |
| 5,677,504 A | * 10/1997 | Kurata | 84/617 |
| 5,787,306 A | * 7/1998 | Michael | 710/9 |
| 6,185,630 B1 | * 2/2001 | Simmons | 710/10 |
| 6,317,804 B1 | * 11/2001 | Levy et al. | 710/305 |

OTHER PUBLICATIONS

DEWE–Book http://www.dewetron.com/dewetron/dew-ebook.asp (as of Oct. 14, 2002).
Dateppli: Innerview ™ http://www.dateppli.com/innerview.html (as of Oct. 4, 2002).
Network Measurements National Instruments http:/www.ni.com/news/articles/9990301network.htm (as of Oct. 14, 2002).

* cited by examiner

Primary Examiner—Matthew Smith
Assistant Examiner—Sun James Lin
(74) Attorney, Agent, or Firm—John Vodopia

(57) ABSTRACT

A software architecture uses a source program and retrievable internal-register configuration models corresponding to data that is specific to different types of ICs, and permits configuration of the internal registers of one of the ICs. In one embodiment, the single source program causes the CPU to select and load one of a plurality of respective models for different types of ICs, to translate the loaded model, and to use the translated model to access the internal register in an IC corresponding to the loaded model. In one specific application, a PC executes the source program and configures the internal registers of an IC that is coupled to the PC through the parallel printer port. By providing an IC definition file for different types of ICs, such a PC can be programmed to reconfigure the internal registers of the corresponding ICs without requiring revisions to the source program.

26 Claims, 3 Drawing Sheets

SYSTEM AND METHOD FOR ACCESSING INTERNAL REGISTERS IN INTEGRATED CIRCUITS

RELATED PATENT DOCUMENT

The present invention is related to a patent document entitled, "System And Method For Testing Integrated Circuits", U.S. patent application Ser. No. 09/469,886, concurrently-filed herewith and incorporated herein by reference in its entirety, now U.S. Pat. No. 6,487,514 issued Nov. 26, 2002.

FIELD OF THE INVENTION

The present invention generally relates to software architectures and, more particularly, to software architectures for programming different integrated circuits.

BACKGROUND OF THE INVENTION

The electronics industry continues to rely upon advances in semiconductor manufacturing technology to realize higher-functioning devices while improving reliability and cost. For many applications, the manufacture of such devices is complex, and maintaining cost-effective manufacturing processes while concurrently maintaining or improving product quality is difficult to accomplish. As the requirements for device performance and cost become more demanding, realizing a successful manufacturing process becomes more difficult.

A byproduct of the increased complexity of semiconductor devices includes ongoing increases in their density and in their configurability. In many instances, the configurability of an integrated circuit (IC) increases significantly with the number of possible applications for the IC. Typically, the configurability of an IC is defined using an internal register that is programmed during or after the IC's manufacture. The internal register, or registers as the case may be, includes bits that are assigned individually or in groups to indicate the functionality of circuitry associated with the IC.

In a typical test application, for example, an IC can have one or more internal registers for passing test data and test control information through various functional stages of the circuitry internal to the IC. Certain bits in the internal registers can be assigned to enable the test mode and disable normal functionality, and other bits in the internal registers can be assigned to identify selected ones of the functional stages and their operation during the test cycles. Different ICs typically have different and unique internal register arrangements and bit assignments.

In applications other than the testing of ICs, configuring the IC is also helpful. For instance, it is often advantageous economically to manufacture a single IC that can be configured to operate in alternative modes with each mode dedicated to a different one of several target markets. Cordless telephones, for example, use chip sets that can be configured for various features. Internal registers are useful in this context for defining which of the various features are to be enabled for implementation at the retail level.

The above applications are representative of many applications in which a CPU is programmed to configure the internal registers of different types of ICs. A CPU is typically defined to access different source programs, with one source program for each type of IC so that the CPU can access the IC's uniquely-defined internal registers. In the area of IC testing, a computer is programmed to conduct tests using a software program customized for the IC device under test. The computer is coupled to an interface board via a conventional communications channel, and the IC is connected to the interface board. Thus, for different ICs there are different test programs designed to access and configure the internal registers of each IC. Since testing each IC is accomplished with a different test program, managing and maintaining many such programs can be cumbersome and error prone. For a change in testing that is required for each of the ICs, each of the test programs would have to be changed, resulting in additional expenditure of time and an increased possibility of introducing an error in each test program.

Accordingly, there is a need for an approach that addresses the aforementioned problems, as well as other related problems. Various embodiments of the present invention provide processes and arrangements for overcoming these problems while providing a number of other advantages as will become apparent from the discussion that follows.

SUMMARY OF THE INVENTION

In various embodiments, the invention provides a method for accessing an integrated circuit (IC) using generic models to model the interface on the physical communication, register map and register semantics levels. This IC-specific information can be kept in an IC definition file that is separate from, and retrievable by, the software source program. By loading the IC-specific information from an IC definition file, the program automatically re-configures itself for the IC at hand. This approach of using the same source codes for many ICs provides significant advantages. For example, in the manufacture and test area, significant time savings are realized in terms of software development, software testing, software documentation and software support. Further, the approach allows for concurrent interface software development and testing while an IC is in design, thereby realizing a working source program even before the IC or even its precise specification is defined.

One embodiment of the present invention is directed to a method for accessing an internal register in one of a plurality of different types of ICs by using a plurality of corresponding models for the different types of ICs. Each of the respective models includes internal-register data that is specific to one of the ICs. Using a programmable processor arrangement, one of the models is loaded into an existing program and translated for use by the programmable processor arrangement. The translated model is then used to access the internal register in an IC corresponding to the loaded model, as though the existing program was specifically designed for the targeted IC.

Another aspect of the present invention is directed to a programmable processor arrangement for accessing an internal register in an IC, where the programmable processor arrangement includes control circuitry and memory circuitry. The control circuitry includes a programmable processor, and the memory circuitry includes program data adapted to be executed by the programmable processor arrangement and to cause the programmable processor to load one of a plurality of respective models for different types of ICs. Each of the respective models includes internal-register data that is specific to an IC, and is adapted to translate the loaded model and to use the translated model to access the internal register in an IC corresponding to the loaded model.

The above summary of the present invention is not intended to describe each disclosed embodiment of the present invention. The figures and detailed description that follow provide additional example embodiments and aspects of the present invention.

BRIEF DESCRIPTION OF THE DRAWINGS

These and additional aspects and advantages of the present invention will become apparent upon review of the Detailed Description and upon reference to the drawings in which.

Figure 1:
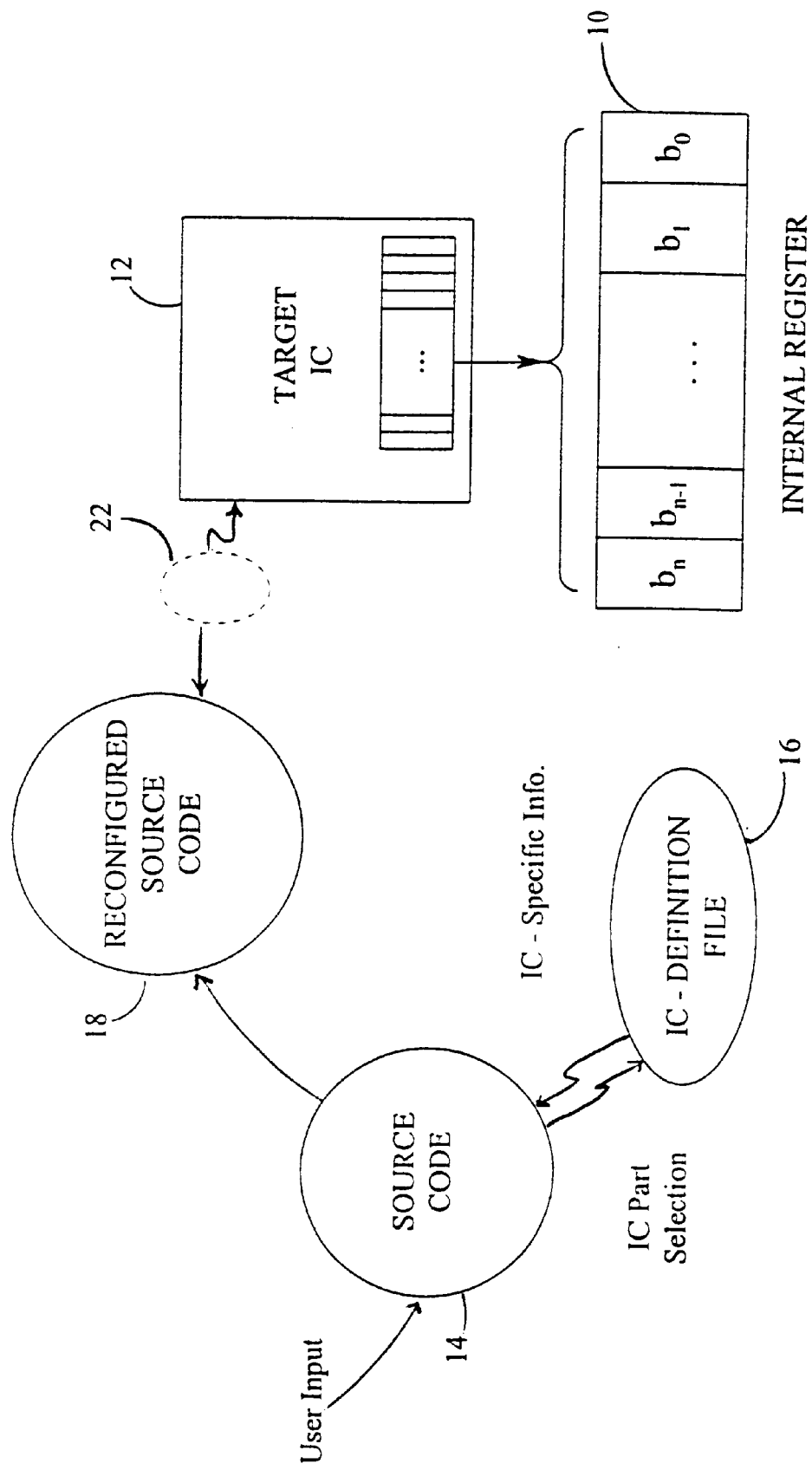
FIG. 1 is a functional block diagram of an example system for accessing data internal to an IC, according to an example embodiment of the present invention.

While the invention is susceptible to various modifications and alternative forms, specific embodiments thereof have been shown by way of example in the drawings and will herein be described in detail. It should be understood, however, that the detailed description is not intended to limit the invention to the particular forms disclosed. On the contrary, the intention is to cover all modifications, equivalents, and alternatives falling within the spirit and scope of the invention as defined by the appended claims.

DETAILED DESCRIPTION

The present invention is believed to be applicable to a variety of systems for accessing (reading from and/or writing to) registers internal to different types of integrated circuits (ICs). The invention has been found to be particularly applicable and beneficial for configuring ICs through their internal registers, for example, in connection with their manufacture, testing of their functionality, and post-manufacture configuration and reconfiguration of their operation. While the present invention is not necessarily so limited, an appreciation of the present invention is presented by way of various example applications benefiting from use of source program adapted to configure the internal registers of a variety of different types of ICs.

In a first example implementation of the present invention, a CPU arrangement is adapted to configure an IC that is coupled to the CPU arrangement via conventional data transport means. The CPU arrangement includes a memory having a program that, when executed, causes the CPU arrangement to download IC-specific information corresponding and permitting access to one of a number of different types of ICs. Using this downloaded IC-specific information, the CPU arrangement automatically reconfigures the program for accessing and/or configuring the IC at hand. This approach of using the same program, or source code, for different IC types provides significant advantages. When used in the manufacture and test area, significant time savings are realized in terms of software development, software testing, software documentation and software support. When used in an engineering project development area, the approach allows for concurrent interface software development and testing while an IC is in design, thereby permitting development of a working source program substantially independent of the effort to define the target IC specifications. For many applications, each of the above advantages cumulate to realize even greater benefits.

In a more specific example embodiment, the target IC is secured to, and communicates through, an interface board that is remotely located from the CPU arrangement via a communication channel. Depending on the application, the communication channel can be or include a LAN, a telephone connection, or a serial interface as may be consistent with an RS-232 or RS-422 specification. The CPU arrangement can access the IC using a conventional or a customized interface circuit. In one example application, a target IC is accessed using generic models to model the interface on the level of the physical communication channel, and on the levels corresponding to the mapping and semantics of the register(s) internal to the target IC. In some applications, it is advantageous to separate the CPU arrangement from the IC-specific information to be downloaded.

For instance, where the target IC is developed after the development of the CPU arrangement's source program, the IC-specific information to be downloaded can be accessed remotely using a communication channel such as one of those discussed above. The IC-specific information can be kept in an IC definition file containing one or a plurality of diffent types of such IC-specific information. Such an IC definition file can be maintained and accessed using any of various storage media, including nonvolatile semiconductor devices, magnetic media and compact disks.

FIG. 1 depicts the data flow of an example system for accessing a register 10 internal to an IC 12, according to an example embodiment of the present invention. A CPU arrangement (not shown) executes a source program, depicted as 14, which responds to user input information by selecting a type of IC to access or configure. An IC-definition file 16, which contains IC-specific information corresponding to the selected type of IC, provides the selected IC-specific information to the CPU arrangement. The CPU arrangement downloads the IC-specific information and, using this downloaded IC-specific information, the CPU arrangement automatically re-configures itself into a program 18 for accessing and/or configuring the internal register 10 of the target IC 12.

As depicted in FIG. 1, the CPU arrangement can download one of a number of IC-specific information sets respectively corresponding to different types of ICs. After downloading the one set that is selected by the user, the CPU arrangement automatically re-configures itself into the corresponding program 18. At the bottom of FIG. 1, the internal register 10 is shown in expanded form with up to "n" bits being identified from $b_0$ to $b_{n-1}$. Because the internal registers of different types of ICs have differing bit assignments and bit functions, there are a number of potential soure program models configured from the source program 14 and the downloaded IC-specific information. Depending on the application, each source program model can be configured to model the interface to the internal register 10 for any particular physical communication channel, and for the appropriate mapping and semantics. Depending on the IC, the internal register 10 can have bit assignments varying in terms of I/O functionality, enablement of features internal and/or external to the target IC 12, settings of capacitor and/or resistor values, communication format/standard assignments, and varying in number from as few as one configurable bit to several multiple-bit bytes or words.

Also shown in FIG. 1 is an optional software driver module 22 that is used to provide further autonomy to the source program 14. When used, the software driver module 22 can permit the source program to be designed for interfacing only to the software driver module 22. In this manner, the software driver module 22 is customized or reconfigured for the physical communication channel and/or any further interface being used to couple to the target IC, thereby removing any such need to configure the source program 14 with information that is specific to the physical communication channel. For such applications, information that is specific to the physical communication channel can be removed from the IC-specific information.

In another embodiment, multiple software drivers are used to drive, respectively, different interfaces (e.g., parallel port, RS-232, and internal PCI digital I/O interface).

Figure 2:
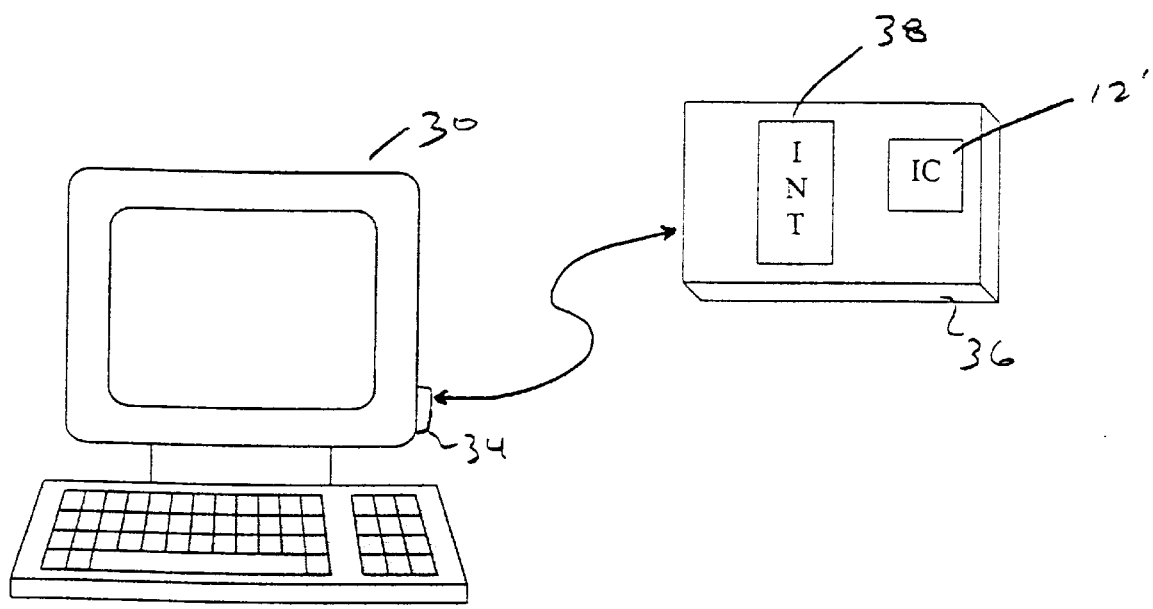
FIG. 2 is a structural block diagram of an example system for accessing data internal to an IC block diagram, according to an example embodiment of the present invention.

In accordance with yet another example embodiment of the present invention, FIG. 2 illustrates an example system in which the above-characterized CPU arrangement is implemented as a desktop computer 30 for accessing data internal to an IC 12' that is communicatively coupled to the desktop computer 30. Advantageously, the desktop computer 30 accesses the IC through a conventional serial or parallel port 34 and an interface board 36. The interface board 36 includes interface circuitry 38 adapted to convert the data presented between desktop computer 30 and the IC 12'. In various embodiments, the interface circuitry 38 is implemented using discrete logic, another microcomputer (CPU) arrangement, and a programmable logic device (PLD).

In another embodiment of the present invention, the desktop computer 30 includes an internal digital I/O card for communicating directly with the IC 12'. In this instance, the interface circuitry 38 does not include logic circuitry. As mentioned above, a software driver can be optionally used to drive the digital I/O card.

In yet another application of the present invention, a CPU arrangement is adapted to repeatedly test and configure different types of ICs for manufacture and/or testing. The block diagram of either FIG. 1 or FIG. 2 can be used for such testing. For example, the desktop computer 30 of FIG. 2 can be implemented as a test system coupled to an interface board (36) adapted to test different types of ICs, with the ICs conventionally mounted on the interface board. A test system of this type can be implemented in various forms as known to those skilled in the art. In one application, the test system is implemented as a micro-computer class computer system.

Different ICs will generally contain from one register to tens of registers for programming various IC functions. The names and numbers of registers, as well as the sizes and read/write access will vary from IC to IC. The registers are further subdivided into sets of bits, wherein each set has a predetermined name and function, which is referred to as a parameter.

Despite similarities in functions, different ICs of the same type (family) sometimes have different pinouts. Thus, dedicated boards have to be made for different ICs. Even for the same IC, sometimes boards with different external components are used. For example, many IC's use external components for reference purposes. Furthermore, some boards use jumpers for manual pin control, while others control IC pins via computer control.

One embodiment of the invention addresses the challenges presented in attempting to test ICs using various combinations of interface boards by using generic test program(s) in combination with IC definition and board configuration files. Each generic test program is suitable for a set of ICs having related characteristics, for example, a family of preamplifier ICs.

The board configuration files provide board specific characteristics for different interface boards. For example, a particular board interface file includes connector pin numbers and signal types (analog, digital, input/output).

Figure 3:
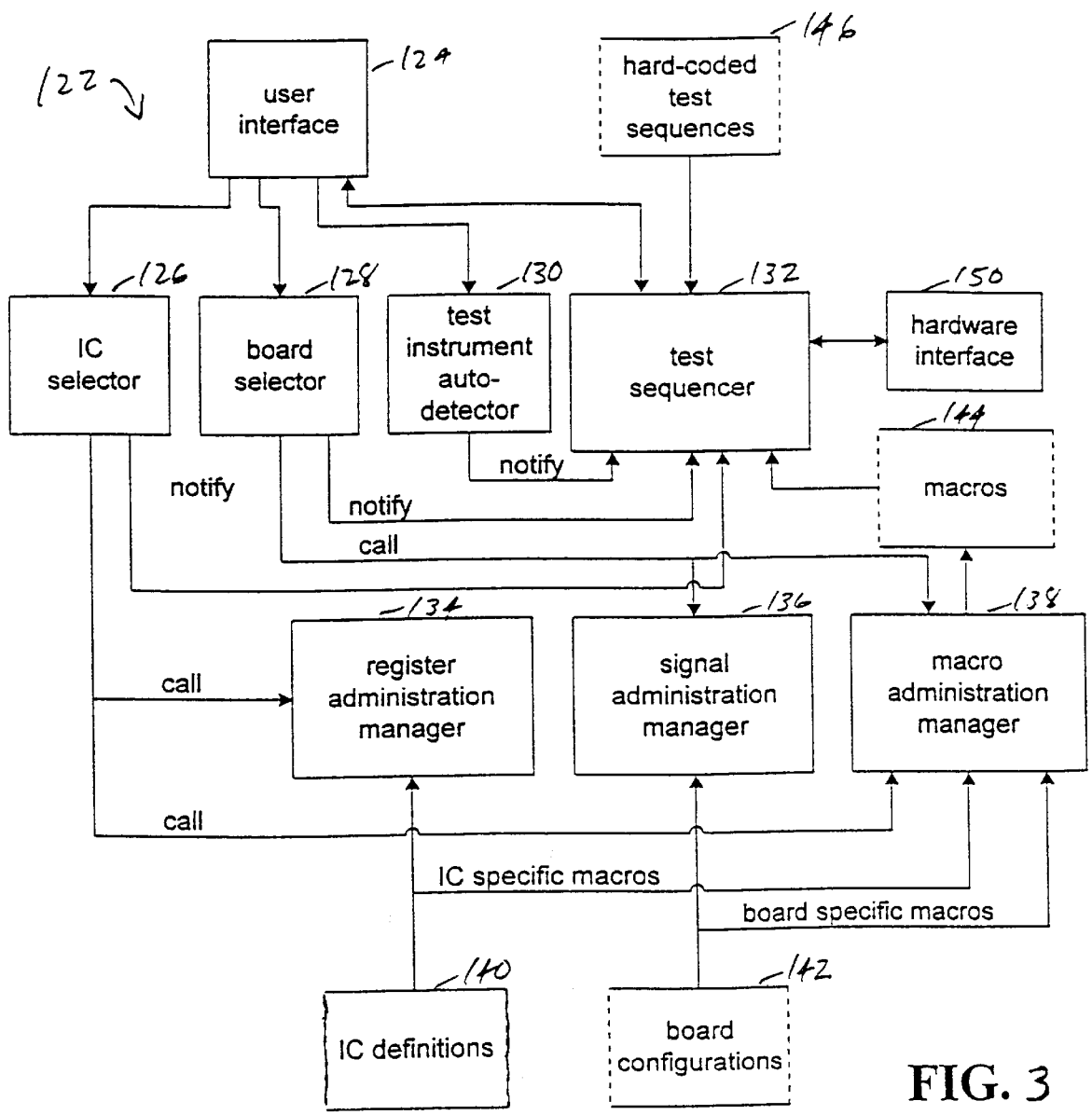
FIG. 3 is a block diagram of a system for testing ICs, according to another example embodiment of the present invention.

FIG. 3 is a functional block diagram of a system 122 for testing ICs in accordance with one embodiment of the invention. The system 122 includes user interface 124, selector processes 126, 128, and 130, test sequencer 132, and administration managers 134, 136, and 138. In one embodiment, user interface 124 is a graphical user interface that allows the user to select a particular type of IC and board for testing. User interface 124 also displays output test results from the IC under test.

Each of IC selector 126, board selector 128, and test instrument auto-detector 130 is a standalone computer process that is initiated by a user from user interface 124. In response to a user selection of an IC, the IC selector parses IC definitions 140 that are associated with the selected IC to check for proper syntax. IC selector 126 also calls register administration manager 134 to initialize set-up of system 122 for testing the selected IC. The macro administration manager 138 is also called by IC selector 126. The macro administration manager creates a new set of test instructions, shown as macros 144, to be applied to the IC under test based on the IC definitions associated with the selected IC.

In response to a user selection of an interface board, the board selector 128 parses board configurations 142 that are associated with the selected board to check for proper syntax. The board selector 128 also calls signal administration manager 136 to initialize set-up of the system 122 for testing the selected IC using the selected board. The macro administration manager 138 is also called by the board selector 128. The macro administration manager 138 creates macros 144 to be applied to the IC under test based on the board configurations associated with the selected board.

Test instrument auto-detector (selector)130 is a user-activated process that detects instruments that are connected via a communications channel (not shown) to the computer system hosting test system 122. A list identifying the test instruments detected is provided to the test sequencer 132, which provides output to the user interface 124 to indicate which instruments are selectable for running a test program.

Test sequencer 132 runs hard-coded test sequences 146 in response to the user interface 124. Changes to a test configuration, for example, a different IC or interface board, are communicated to the test sequencer 132 via "notify" messages from IC and board selectors 126 and 128. In executing a hard-coded test sequence, the test sequencer 132 reads macros 144 and adapts the hard-coded test sequence in accordance with the selected IC or board and associated macros.

IC definitions 140 are stored in an IC definition file. In one embodiment, there is a separate IC definition file for each different IC. Each definition file includes information pertaining to the power supply voltages (minimum, maximum, and nominal), register definition data, and macros.

Each register has associated therewith register definition data. The register definition data includes the names of the registers, the hardware addresses of the registers, the numbers of bits/register, and associated read/write accessibility.

In the register definitions, a mnemonic is assigned to a group of bits in a register that together define a function. In the register definition, the position of the group of bits within the register is also specified. Several translation types are provided to deal with translation of bit contents to functions and vice versa.

The macros in IC definitions 140 specify various test actions that are specific to the IC associated with the definitions. For example, the actions include setting a register or signal value to a particular value.

In one embodiment, macros are specified in accordance with the following format. A mnemonic of the macro is specified first and is followed by a label of the action, which is enclosed in quotation marks. The label is followed by an "@" character, which indicates that one or more actions follow. The actions are separated by semicolons.

Depending on the type of IC, there are various types of actions that can be specified in a macro. For example, in a preamplifier, the actions may include delaying the test program for a specified time, displaying an IC-specific message in a user-interface dialog box, setting a register/signal value to a constant or test-specific value, and getting a register/signal value.

Board configurations 142 are stored in a board configuration file. In one embodiment, there is a separate board configuration file for each different interface board. Each configuration file includes information pertaining to the board related electrical settings (e.g., the reference resistance level), signal definitions, and macros.

Each signal has associated therewith signal definition data. The signal definition data includes the names of the signals, the physical ports associated with the signals, the types of the signals, and type-dependent information associated with the signals. The port identifiers are those generally recognized as being associated with a particular interface board.

The signal type is one of digital output, digital input, analog output, analog input, manual digital, and manual analog. Other than for the manual signal types, the test program controls the input signals and receives the output signals based on the specified signal type. For the manual signals, when the test program needs to set the signal RWN to "Read", the user is prompted with "Please set the digital signal named "RWN at TP16 to Read". The manual signal type specification also allows a user to manually enter a signal value for recording purposes. For example, the user can measure the band-gap voltage using a multimeter and input the measured value which is recorded in signal measurement files.

Signal definitions that are specific to the signal type are as follows. A digital signal can be defined to be inverted or not inverted. That is, when a digital signal that defined to be inverted, the test program inverts the logical state of the signal that was read or is to be applied. For an analog signal, lower and upper limits expected of the signal can be specified. The test program then sets the dynamic range as appropriate for the interface board.

The macros in board configurations 142 specify various test actions that are specific to the interface board associated with the definitions. For example, the actions include setting up for current measurements, reading signal values, and applying signal values. The format for the signal-related macros is similar to that described above in relation to the register-related macros.

Macros 144 include the macros read from the stored IC definitions 140 and stored board configurations 142 that are associated with the selected IC and interface board. Macros 144 are provided to test sequencer 132 for adapting and configuring the hard-coded test sequence during execution of the test sequence.

Hardware interface 150 represents conventional software that provides an interface between a test program and the communications channel that connects system 122 to an interface board.

Using these functional blocks of FIG. 3, a first aspect of the test implementation involves the creation of generic models on the physical communication, register map and register semantics levels. The models should be sufficiently generic so that they can easily be expanded and/or amended to accommodate other situations and applications, if needed. The next part of the test implementation involves writing the program, e.g., source code, to: parse the IC definition file; interpret the model parameters properly; handle the dynamic creation of register objects; and handle the dynamic change of labels, data types and translation in an efficient and flexible manner, using a register administration manager software module. The following example model for a serial-interface communication application is illustrative.

In this example, a reusable driver software module, such as discussed in connection with item 22 of FIG. 1, is used to handle the handshake in a manner that tightly couples the hardware that communicates with the IC serial interface. There are many possible approaches, each being consistent with various embodiments of the present invention. In one implementation, the driver communicates via the PC printer port to a serial interface board, which includes a programmable logic device (PLD) to handle the actual serial interface communication with the IC. In this implementation, a small part of the IC differences is handled in hardware and the majority of the differences among various ICs is handled in software.

Communication of the serial bits is dependent upon the target ICs. Different ICs use different numbers of bits in the serial interface communication.

The model may also include a serial read-write mask. This mask indicates the mask in the address bits that define the serial interface read/write operation. For example, a mask of x80 (Hexidecimal) can mean that bit #7 in the address bits signifies whether the command is a read or write command; that is, R/_W bit can be 1 or 0 for read or write, respectively. The bit order inside an address and data byte to be sent out to the serial interface can be reversed or not reversed.

The model may further include a chip-select mask to indicate the mask in the address bits that define the chip select bits (CS0, CS1, etc.).

In connection with such a serial interface, some chips use a certain CS value to indicate a broadcast write command to all ICs on the serial interface bus. This value specifies what CS value corresponds to broadcast mode. The label between quotation marks (e.g., "servo") gives an IC-specific label to the broadcast mode. For example, where the broadcast CS value corresponding to 3 "Servo" is interpreted as $CS$ value=3, with the label "servo" being used on the user interface for the broadcast mode. If an IC does not have a broadcast mode, this line can be absent.

The development of the communication between the main or generic program and the target IC can include model for the mapping to the IC registers and for the semantics of the various registers. An example register map space can be defined to include: the names of registers, the hardware addresses of registers, the number of registers, the number of bits per register, and with the associated read/write accessibility specified on a bit-by-bit basis. An example model for register semantics includes: a mnemonic is given to a group of bits in a register that together defines a function; each function can be assigned with a meaningful label, for display on the user interface; the logical grouping of mnemonics into clusters is specified in the IC definition file. This approach allows the software to dynamically group register functions together for display on the user interface.

Several translation types can be defined to deal with translation of bit contents to functions and vice versa. For example, a hardware translation type can be used to define the existence of a physical register in an IC. A linear translation type can be used to map bit contents to real values using a linear equation with a pre-defined form and vice versa; this translation type is suitable for example in connection with a programmable parameter level that allows many bits of programmability in a linear fashion. "Tabstring" can be used to map bit contents to strings in a tabular form and vice versa; this translation type is suitable for mapping function descriptions to bits. For example, 'ON' means bit content=0, while 'OFF' means bit content=1. Another translation type, "tabfloat," can be used to map bit contents to floating point values in a tabular form and vice versa; this translation type is suitable for mapping real values to bits and the mapping relationship cannot be easily described by a linear equation. For example, bit contents 00, 01, 10, 11 may map to '0.23', '−0.14', '1.0', '4.6' respectively. Similarly, "tabint" can be used to map bit contents to integer values in a tablular form and visa versa.

An example set of IC definition parameters (e.g., as stored in an IC definitiion file) for use by a generic IC test program can include the file name and a corresponding file format including the following items: file header, available plug-ins (to allow dynamic additions), an IC file description, serial interface communication, register definition, and other items particular to an IC group. For example, IC type, a power supply, and relevant macros are also included items.

In this same example test application, keywords can be used to illustrate the serial protocol for communication from the generic program to the target IC with keyword definitions for typical register configuration commands: 'Write Outbound Packet', 'Read Outbound Packet' and 'Read Inbound Packet.' For these commands, the following example communication protocol can be used where "CS," "R" and "D" indicate respectively "chip select," "register number" and "data bit," and after these keywords, a decimal number is attached to indicate the bit number. The character "!" indicates logic inversion, e.g., '!CS0", "!0" (equivalent to "1")). For the Write Outbound Packet, the bits from the first bit in a write command to the last can be:

0 CS0 CS1 R0 R1 R2 R3 R4 D0 D1 D2 D3 D4 D5 D6 D7.

In this example, the first bit in a write command is a constant=0, to indicate a write command. The second and third bits are chip select (CS) bits, which are then followed by 5 bits for the register number, and then followed by 8 bits of data.

For the Read Outbound Packet, the bits from the first bit in a write command to the last can be:

1 CS0 CS1 R0 R1 R2 R3, R4.

For the Read Inbound Packet, the bits from the first bit in a write command to the last can be:

D0 D1 D2 D3 D4 D5 D6, D7.

For further details regarding a test application of the this type, reference may be be made to the above-referenced patent document entitled, "System And Method For Testing Integrated Circuits."

Accordingly, the present invention provides, among other aspects, a method and apparatus for accessing an internal register in an IC (integrated circuit), with respective models for different types of ICs being used to configure a generic source program. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

We claim:

1. A method for accessing an internal register in a stand-alone target IC (integrated circuit), comprising:

providing a plurality of respective models for different types of ICs, each of the respective models including internal-register data that is specific to one type of IC; and using a programmable processor arrangement, loading one of the models, the loaded model corresponding to the stand-alone target IC, utilizing the loaded model to reconfigure a common program for accessing or configuring the stand-alone target IC associated with the loaded model, and using the reconfigured common program obtained from the loaded model to access the internal register in the stand-alone target IC corresponding to the loaded model.

2. The method of claim 1, wherein using the reconfigured common program obtained from the loaded model to access the internal register includes accessing the internal register over a data bus.

3. The method of claim 2, further including providing a software driver module adapted to be executed by the programmable processor arrangement by accessing the internal register over the data bus.

4. The method of claim 1, wherein the programmable processor arrangement is part of a personal computer having an accessory interface port, and further including providing a software driver module adapted to be executed by the personal computer and to cause the personal computer to access the internal register through the accessory interface port.

5. The method of claim 1, wherein using the reconfigured common program obtained from the loaded model to access the internal register includes accessing the internal register using a programmable hardware interface to configure the stand-alone target IC via the internal register.

6. The method of claim 5, wherein the programmable processor arrangement further including providing a software driver module adapted to cause the programmable processor arrangement to access through an accessory interface port.

7. The method of claim 1, wherein using the reconfigured common program obtained from the loaded model to access the internal register includes reading data from the internal register.

8. The method of claim 1, wherein using the program obtained from the loaded model to access the internal register includes writing data to the internal register.

9. The method of claim 1, wherein using the reconfigured common program obtained from the loaded model to access the internal register in an IC corresponding to the loaded model includes reading data from the internal register.

10. The method of claim 1, wherein using a programmable processor arrangement includes accessing program segments respectively adapted to interpret parameters of the loaded model.

11. The method of claim 1, wherein utilizing the loaded model includes creating register objects for the IC corresponding to the loaded model.

12. A system for accessing an internal register in a stand-alone target IC (integrated circuit), comprising:

storage means for storing a plurality of respective models for different types of ICs, each of the respective models including internal-register data that is specific to one type of IC; and means for loading one of the models, corresponding to the stand-alone target IC, from the storage means, and utilizing the loaded model to reconfigure a common program for accessing or configuring the stand-alone target IC associated with the loaded model, and using the reconfigured common program obtained as a result of the loaded model to access the internal register in the target IC corresponding to the loaded model.

13. A system for accessing an internal register in a stand-alone target IC (integrated circuit), comprising:

a programmable processor arrangement;

an IC definition file having a plurality of respective models for different types of ICs, each of the respective models including internal-register data that is specific to one type of IC; and a program adapted to be executed by the programmable processor arrangement and to cause the programmable processor arrangement to load one of the models corresponding to the stand-alone target IC from the IC definition file, to utilize the loaded model to reconfigure a common program for accessing or configuring the stand-alone target IC associated with the loaded model, and to use the reconfigured program obtained as a result of the loaded model to access the internal register in the stand-alone target IC corresponding to the loaded model.

14. A system for accessing an internal register in a stand-alone target IC, according to claim 13, wherein the programmable processor arrangement includes an accessory interface port adapted to communicatively couple the programmable processor arrangement and the internal register in the stand-alone target IC.

15. A system for accessing an internal register in a stand-alone target IC, according to claim 14, further including an interface board including a logic circuit adapted to convert data between the programmable processor arrangement and the internal register in the stand-alone target IC.

16. A system for accessing an internal register in a stand-alone target IC, according to claim 14, wherein the logic circuit includes a programmable logic IC device adapted to be programmed for communicating with the internal register in the stand-alone target IC.

17. A system for accessing an internal register in a stand-alone target IC, according to claim 14, wherein programmable processor arrangement is adapted to present data to the stand-alone target IC directly.

18. A system for accessing an internal register in a stand-alone target IC, according to claim 14, wherein the accessory interface port is a parallel port.

19. A system for accessing an internal register in a stand-alone target IC, according to claim 14, wherein the interface board is adapted to present data to the stand-alone target IC and wherein the accessory interface port is a parallel port.

20. A system for accessing an internal register in stand-alone target IC, according to claim 14, further including an interface board including a logic circuit adapted to convert data between the programmable processor arrangement and the internal register in the stand-alone target IC, wherein the interface board is adapted to present data to the stand-alone target IC and wherein the accessory interface port is a parallel port.

21. A programmable processor arrangement for accessing an internal register in a stand-alone target IC (integrated circuit), comprising:

control circuitry including a programmable processor; and memory circuitry including program data adapted to be executed by the programmable processor arrangement and to cause the programmable processor to load one model of a plurality of respective models for different types of ICs wherein each of the respective models includes internal-register data that is specific to one type of IC, to utilize the loaded model to reconfigure a common program for accessing or configuring the stand-alone target IC associated with the loaded model, and to use the reconfigured common program obtained as a result of the loaded model to access the internal register in the stand-alone target IC corresponding to the loaded model.

22. A programmable processor arrangement, according to claim 21, wherein the memory circuitry includes an IC definition file having the plurality of respective models for different types of ICs.

23. For use in a system having a programmable processor arrangement adapted to access an internal register in a stand-alone target IC (integrated circuit), storage media comprising:

processor-executable data adapted to cause a processor arrangement to load one of a plurality of respective models for different types of ICs wherein each of the respective models includes internal-register data that is specific to one type of IC, to utilize the loaded model to reconfigure a common program for accessing or configuring the the stand-alone target IC associated with the loaded model, and to use the reconfigured common program obtained as a result of the loaded model to access the internal register in the stand-alone target IC corresponding to the loaded model.

24. The storage media of claim 23, further including the plurality of respective models for different types of ICs.

25. The storage media of claim 23, wherein the plurality of respective models for different types of ICs are arranged and organized in an IC definition file.

26. The storage media of claim 23, further including an IC definition file arranged and organized to include the plurality of respective models for different types of ICs.

* * * * *